United States Patent [19]

Cowley

[11] Patent Number: 4,746,873

[45] Date of Patent: May 24, 1988

[54] FM DEMODULATORS

[75] Inventor: Nicholas P. Cowley, Wroughton, England

[73] Assignee: Plessey Overseas Limited, Ilford, England

[21] Appl. No.: 898,176

[22] Filed: Aug. 20, 1986

[30] Foreign Application Priority Data

Aug. 22, 1985 [GB] United Kingdom ............... 8521061

[51] Int. Cl.⁴ ............................................. H03D 3/00
[52] U.S. Cl. .................................... 329/110; 329/116; 329/131; 455/232
[58] Field of Search ............... 329/110, 116, 124, 131, 329/134, 136, 160, 178, 192; 375/80, 98, 99; 455/214, 216, 323, 333, 337, 210, 232

[56] References Cited

U.S. PATENT DOCUMENTS 4,608,539 8/1986 Lawton ............................. 455/216

Primary Examiner—Eugene R. LaRoche
Assistant Examiner—David Mis
Attorney, Agent, or Firm—Michael R. Oglo; Julian C. Renfro

[57] ABSTRACT

Apparatus for obtaining programmable threshold extension of an FM demodulator comprises a limiter preamplifier 4 and a variable gain buffer amplifier 6. The buffer amplifier 6 is provided with an external control node 16 such that the signal level fed from the buffer amplifier 6 to an injection locked oscillator/divider 8 can be programmed in dependence upon a control signal applied to the external control node 16. In this manner threshold extension of the FM demodulator can be selectively applied in dependence upon the noise level in an FM input signal to be demodulated. The limiter preamplifier 4 and the buffer amplifier 6 may form part of an automatic gain control circuit.

8 Claims, 1 Drawing Sheet

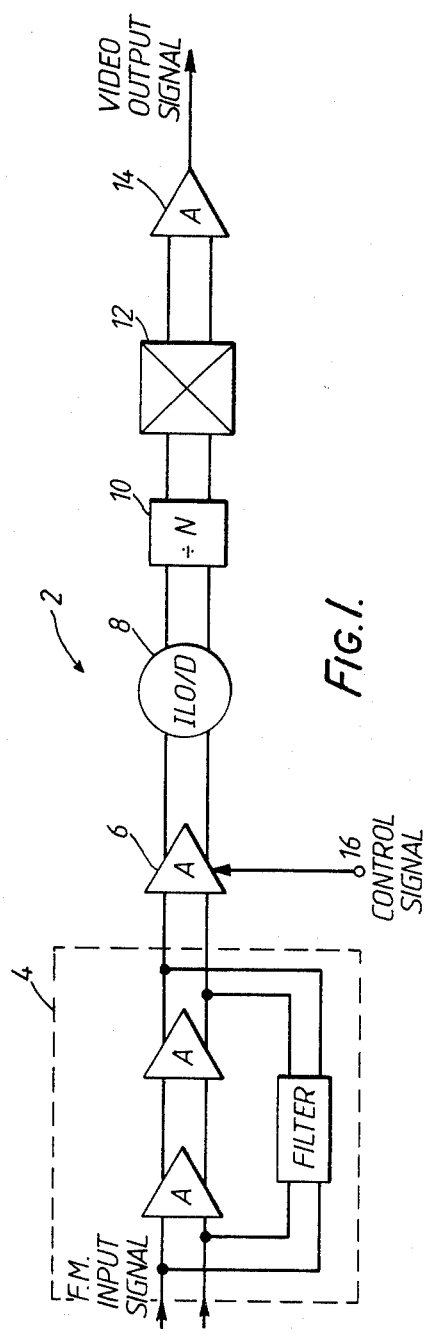
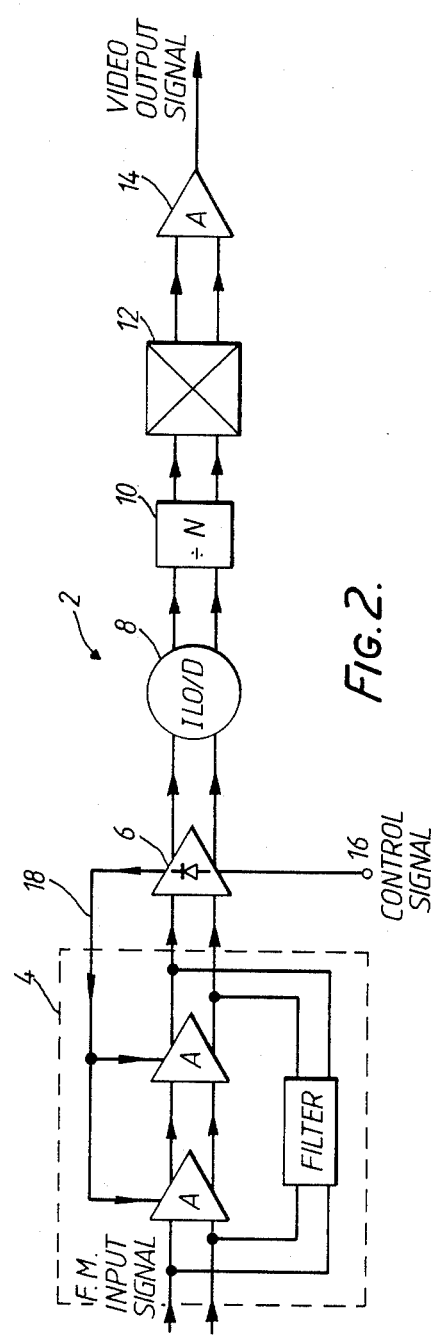

FM DEMODULATORS

The present invention relates to improvements in or relating to demodulators for frequency modulated signals, hereinafter referred to as FM demodulators, and in particular, to apparatus for obtaining programmable threshold extension in FM demodulators.

Present FM demodulator systems which utilise a quadrature demodulator to effect demodulation, such as the Plessey (trade mark) SL 1452 demodulator, have, typically, a theoretical carrier signal to noise signal threshold of approximately 10.5 dB. Carrier signal to noise signal threshold is the input carrier signal to noise signal ratio where the noise begins to introduce characteristic FM noise into the system. If the FM modulated signal is a broadcast video signal the introduction of such characteristic FM noise into the system will give rise to 'sparklies' in the demodulated video picture, and thus, degrades the quality of the video picture whereby it may become unacceptable to a viewer of the picture. Furthermore, a threshold level of about 10.5 dB is unacceptably high for many applications and hence, some means of threshold extension must be applied to the demodulator.

Threshold extension is a method of extending the carrier signal to noise signal ratio into an increasingly noisy signal yet still obtaining the same quality demodulated output signal as at higher carrier to noise ratios. For video FM broadcast signals, this would enable an acceptable quality of video images to be maintained from noisier input signals to the FM demodulator.

Threshold extension may be obtained by preceding the demodulator with an injection locked oscillator/divider. An injection locked oscillator/divider is a mixer oscillator combination whose natural output frequency tends to lock to the frequency of the signal injected into the oscillator/divider, or a sub harmonic of that frequency. To provide threshold extension in FM demodulators, the FM signal to be demodulated is injected into the mixer input port and, provided the frequency deviation is not excessive, the oscillator/divider output frequency, or a sub harmonic thereof, will tend to phase lock to the FM input signal. The maximum permissable deviation is proportional to the level of the signal which is injected into the input port of the mixer. Hence, the threshold extension provided by such systems is critical on the level of the input signal to the injection locked oscillator/divider.

Automatic gain control circuits may be used to provide a constant level of input signal but such circuits cannot distinguish between strong and weak FM input signals. Threshold extension is therefore applied irrespective of the strength of the input signal; even when the FM input signal is sufficiently strong to provide an acceptable quality of demodulated output signal without the need for threshold extension.

Providing threshold extension normally results in reduced video bandwidth in the demodulated output signal. Hence, the use of threshold extension is not always advantageous as an unnecessary reduction in the video bandwidth of the output signal from the demodulator may arise in those signals which are sufficiently strong to provide an acceptable quality of demodulated output signal without the need for threshold extension.

It is an intention of the present invention to alleviate this problem by the provision of aparatus which can provide programmable threshold extension of the FM demodulator.

Accordingly, there is provided an FM demodulator comprising a gain control circuit arranged to provide a substantially constant level of output signal over a range of levels of input signal afforded thereto, and an injection locked oscillator divider coupled to the gain control circuit, wherein the gain control circuit is provided with a control node arranged to receive a control signal for further controlling the level of the output signal from the gain control circuit, the control signal being selected in dependence upon the strength of an FM input signal to be demodulated, whereby the degree of threshold extension provided by the demodulator can be programmed in accordance with the strength of the FM input signal.

Advantageously, the gain control circuit comprises a preamplifier limiter which is serially coupled to a variable gain buffer amplifier. The level of the output signal of the gain control circuit can be programmed by adjusting the gain of the buffer amplifier by means of the control signal afforded to the external control node. Preferably, the preamplifier limiter comprises a linear phase multi stage amplifier.

The present invention will now be described, by way of example, with reference to the accompanying drawings in which FIG. 1 illustrates a schematic block diagram of an FM demodulator incorporating apparatus for providing programmable threshold extension in accordance with the present invention; and FIG. 2 illustrates a schematic block diagram of an FM demodulator as shown in FIG. 1 but incorporating an automatic gain control loop in the threshold extension circuit.

Referring to FIG. 1, an FM demodulator 2 comprises a preamplifier limiter 4 for receiving an FM input signal which is to be demodulated, such as a 600 MHz video I.F. signal. The preamplifier limiter 4 is coupled via a variable gain stage, such as a buffer amplifier 6, to an injection locked oscillator/divider 8 for providing threshold extension of the FM demodulator. The preamplifier limiter/buffer amplifier combination comprises the gain control circuit described above. The output signal from the injection locked oscillator/divider 8 is coupled via a divider 10 to a frequency discriminator, such as a quadrature demodulator 12, for demodulating the FM signal. An amplifier 14 is provided for amplifying the demodulated output signal from the quadrature demodulator 12 to supply a video output signal.

The buffer amplifier 6 includes an external control node 16 for receiving a control signal, as shown in FIG. 1. The preamplifier limiter 4 in combination with the buffer amplifier 6 acts as a gain control circuit which can provide a substantially constant level of signal to the injection locked oscillator/divider 8 for a range of levels of the FM input signal. The gain of the buffer amplifier 6 can be controlled by the control signal which is applied to the control node 16 and therefore, the level of the output signal from the gain control circuit, and hence the degree of threshold extension provided, can be programmed in dependence upon the control signal at the external control node 16.

In the embodiment shown the preamplifier limiter 4 is a multi-stage amplifier which has linear phase characteristics combined with a frequency band which is able to accomodate a wide range of frequencies of the IF input signal, typically from about 60 to 1000 MHz. The linear phase of the preamplifier limiter 4 ensures that any phase shifts which may be introduced by the device between the input and output are substantially constant over the frequency range of interest. The preamplifier limiter 4 is also designed such that it has a wide dynamic range; that is, the power of the output signal which is fed to the input of the buffer amplifier 6 is substantially invariant between predefined limits of power level in the FM input signal. These chosen characteristics of the preamplifier limiter 4, in combination with the buffer amplifier 6 with the control node 16, facilitate the programming of the level of the input signal to the injection locked oscillator/divider 8. In the embodiment shown in FIG. 1 the preamplifier limiter 4 is a multi-stage amplifier. A single stage amplifier may, however, be used for the preamplifier limiter.

The preamplifier limiter 4 may also form part of an automatic gain control circuit either with itself or with the following buffer amplifier 6, as shown in FIG. 2. An automatic gain control loop 18 is provided to achieve more accurate control of the level of the signal fed to the injection locked oscillator/divider 8, as programmed by the control signal at the node 16 of the buffer amplifier 6.

The apparatus of the present invention may be used in satellite demodulator systems where threshold extension is frequently required. The preamplifier limiter 4 and buffer amplifier 6 for providing threshold extension, in combination with the injection locked oscillator/divider and the FM demodulator, may be fabricated as an integrated circuit device which could replace a discrete IF strip amplifier with automatic gain control, and an FM demodulator which may or may not be provided with threshold extension. The apparatus of the present invention may also be provided with a surface acoustic wave (SAW) filter which may or may not be provided with a SAW preamplifier. The demodulator, including the SAW preamplifier, may be fabricated as an integrated circuit device. Alternatively the preamplifier limiter 4 and buffer amplifier 6 may be fabricated as a stand alone integrated circuit device for use in combination with any form of existing FM demodulator, such as phase lock loop demodulators.

Although the present invention has been described with respect to a particular embodiment it should be understood that modifications can be effected within the scope of the invention. For example, if the frequency of the FM input signal is within the range of operation of the quadrature demodulator 12, typically up to about 150 MHz, the device may not be provided with the divider 10.

Furthermore, the amplifier 14 for amplifying the demodulated signal may not form part of the apparatus but may be provided as a stand alone device.

From the foregoing description it can be seen that the FM demodulator of the present invention is advantageous over known demodulators as the degree of threshold extension is controlled in accordance with the strength of the input signal, thereby maximising the bandwidth in the demodulated signal for any strength of FM input signal.

Furthermore, the operation of the demodulator can be controlled so that no threshold extension is applied when the strength of the FM input signal exceeds a predetermined level which is found to produce acceptable quality of demodulated output signal without the need for threshold extension.

I claim:

1. An FM demodulator comprising a gain control circuit arranged to provide a substantially constant level of an FM output signal afforded thereto, and an injection locked oscillator divider being afforded the FM output signal from the gain control circuit, wherein the gain control circuit is provided with a control node arranged to receive a control signal for further controlling the level of the FM signal from the gain control circuit, the control signal being selected in dependence upon the strength on the FM input signal to be demodulated, whereby the degree of threshold extension provided by the demodulator can be programmed in accordance with the strength of the FM input signal.

2. An FM demodulator according to claim 1 wherein the gain control circuit is arranged to respond to the control signal such that, when the strength of the FM input signal is above a predetermined level, no threshold extension is provided by the demodulator whereby the band width of a demodulated ouput signal from the demodulator obtained from FM input signals above the predetermined level is maximized.

3. An FM demodulator according to claim 1 or claim 2 wherein the gain control circuit comprises a preamplifier limiter serially coupled with a variable gain buffer amplifier arranged such that the level of the output signal from the gain control circuit can be programmed by adjusting the gain of the buffer amplifier by means of the control signal afforded to the control node.

4. An FM demodulator according to claim 3 wherein the preamplifier limiter comprises a linear phase multistage amplifier.

5. An FM demodulator according to claim 3 wherein the gain control circuit comprises a closed loop automatic gain control circuit.

6. An FM demodulator according to claim 3 further comprising an FM demodulator coupled to the output of the injection locked oscillator/divider.

7. An FM demodulator according to claim 6 comprising a divider circuit coupled between the injection locked oscillator/ divider and the FM demodulator.

8. An FM demodulator according to claim 7 wherein the FM demodulator comprises a quadrature demodulator.

* * * * *